United States Patent [19]
Teichman et al.

[11] Patent Number: 6,145,648
[45] Date of Patent: *Nov. 14, 2000

[54] METHOD AND SYSTEM FOR CONTINUOUSLY PROCESSING SUCCESSIVE WORKPIECES ALONG A PRODUCTION LINE

[75] Inventors: Eyal Teichman, Tel-Aviv; Israel Altman, Kiriat Ono; Shabtay Negry, Givat Shmuel; Nimrod Lev, Ganey Yehuda; Tal Hadasi, Rakefet; Yizhak Linyado, Rehovot, all of Israel

[73] Assignee: Orbotech Ltd., Yavne, Israel

[ * ] Notice: This patent issued on a continued prosecution application filed under 37 CFR 1.53(d), and is subject to the twenty year patent term provisions of 35 U.S.C. 154(a)(2).

[21] Appl. No.: 09/010,582

[22] Filed: Jan. 22, 1998

[30] Foreign Application Priority Data

Jan. 24, 1997 [IL] Israel ......................................... 120071

[51] Int. Cl.[7] .................................................. B65G 47/34

[52] U.S. Cl. ................................... 198/468.6; 198/774.1; 414/222.02; 414/788.7

[58] Field of Search .................... 414/222.01, 222.02, 414/225.01, 788.07, 793, 797; 198/468.2, 468.6, 774.1; 209/539

[56] References Cited

U.S. PATENT DOCUMENTS

| | | |
|---|---|---|
| 3,052,339 | 9/1962 | Carter . |
| 3,100,039 | 8/1963 | Oderman et al. ................ 198/369.4 X |
| 3,522,942 | 8/1970 | Hepp . |
| 3,680,677 | 8/1972 | Branch et al. . |
| 4,274,529 | 6/1981 | Mori et al. ............................ 198/463.3 |
| 4,301,958 | 11/1981 | Hatakenaka et al. ................ 198/341 X |
| 4,730,526 | 3/1988 | Pearl et al. . |
| 4,747,477 | 5/1988 | Benz et al. . |
| 4,846,623 | 7/1989 | Otani et al. .......................... 198/468.6 |
| 4,962,841 | 10/1990 | Kloosterhouse ........................ 198/372 |
| 5,084,829 | 1/1992 | Kato .................................. 414/222.02 |
| 5,125,497 | 6/1992 | Sündermann ..................... 198/774.1 X |
| 5,165,516 | 11/1992 | Reed et al. ................................ 198/372 |
| 5,222,585 | 6/1993 | van der Werff ......................... 198/372 |
| 5,352,085 | 10/1994 | Sargent et al. .......................... 414/796 |
| 5,366,212 | 11/1994 | Crowley et al. ................. 198/418.8 X |
| 5,441,380 | 8/1995 | Horikawa .............................. 414/788.7 |
| 5,533,861 | 7/1996 | Klupfel ........................... 198/468.6 X |
| 5,588,797 | 12/1996 | Smith ............................... 414/788.7 X |
| 5,609,236 | 3/1997 | Neukam .............................. 198/370.1 |
| 5,626,238 | 5/1997 | Blanc ............................ 198/370.04 X |

FOREIGN PATENT DOCUMENTS

| | | |
|---|---|---|
| 0296096 | 12/1988 | European Pat. Off. . |
| 0 477 104 | 3/1992 | European Pat. Off. . |
| 0 855 856 | 1/1998 | European Pat. Off. . |
| 0 841 844 | 5/1998 | European Pat. Off. . |
| 2 599 347 | 12/1987 | France . |
| 26 634 | 2/1987 | Germany . |
| 5-105238 | 4/1993 | Japan ................................. 414/788.7 |
| 2155910 | 10/1985 | United Kingdom . |

OTHER PUBLICATIONS

Japan Abstract 60188232, "Planar sample conveyor device", Sep. 25, 1985.

Belgium Abstract 835748, May 5, 1976.

German Abstract 19645760, May 5, 1998.

*Primary Examiner*—Tuan N. Nguyen
*Attorney, Agent, or Firm*—Browdy And Neimark

[57] ABSTRACT

A system for continuously processing successive workpieces along a production line having a loader for loading workpieces onto main conveyor for conveying through a workstation and an unloader for unloading a processed workpiece. The loading and unloading are achieved without disturbing the main conveyor during operation of the workstation so as not to vibrate the workpiece during operation of the workstation. According to one embodiment, the workpiece is a printed circuit board and the workstation is an optical inspecting system.

9 Claims, 13 Drawing Sheets

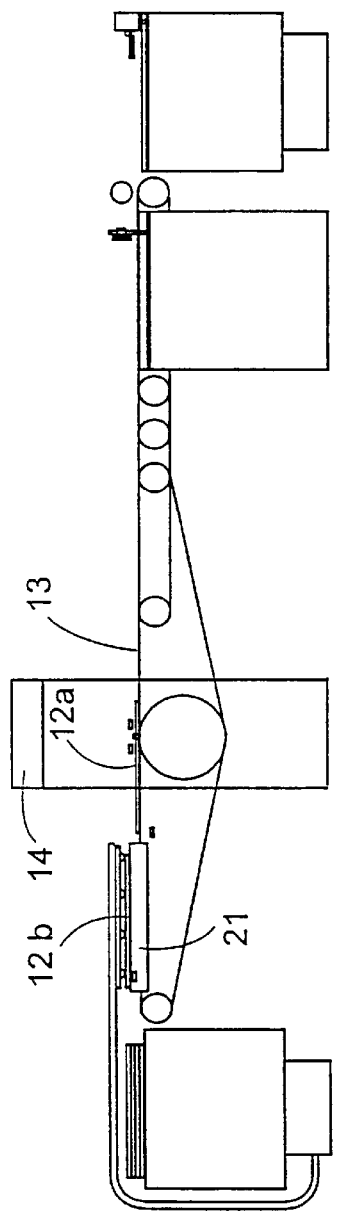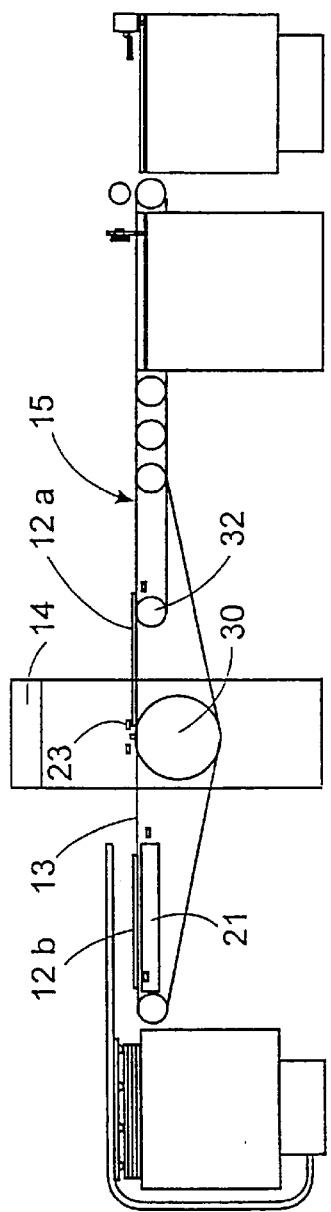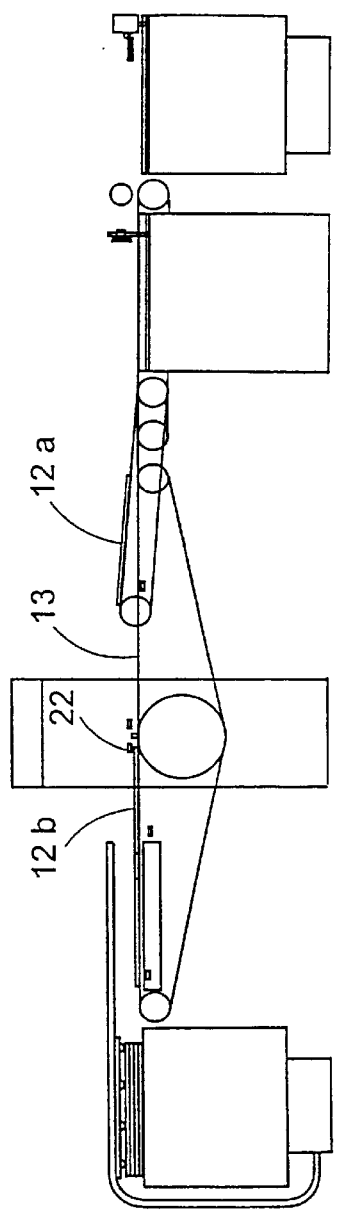

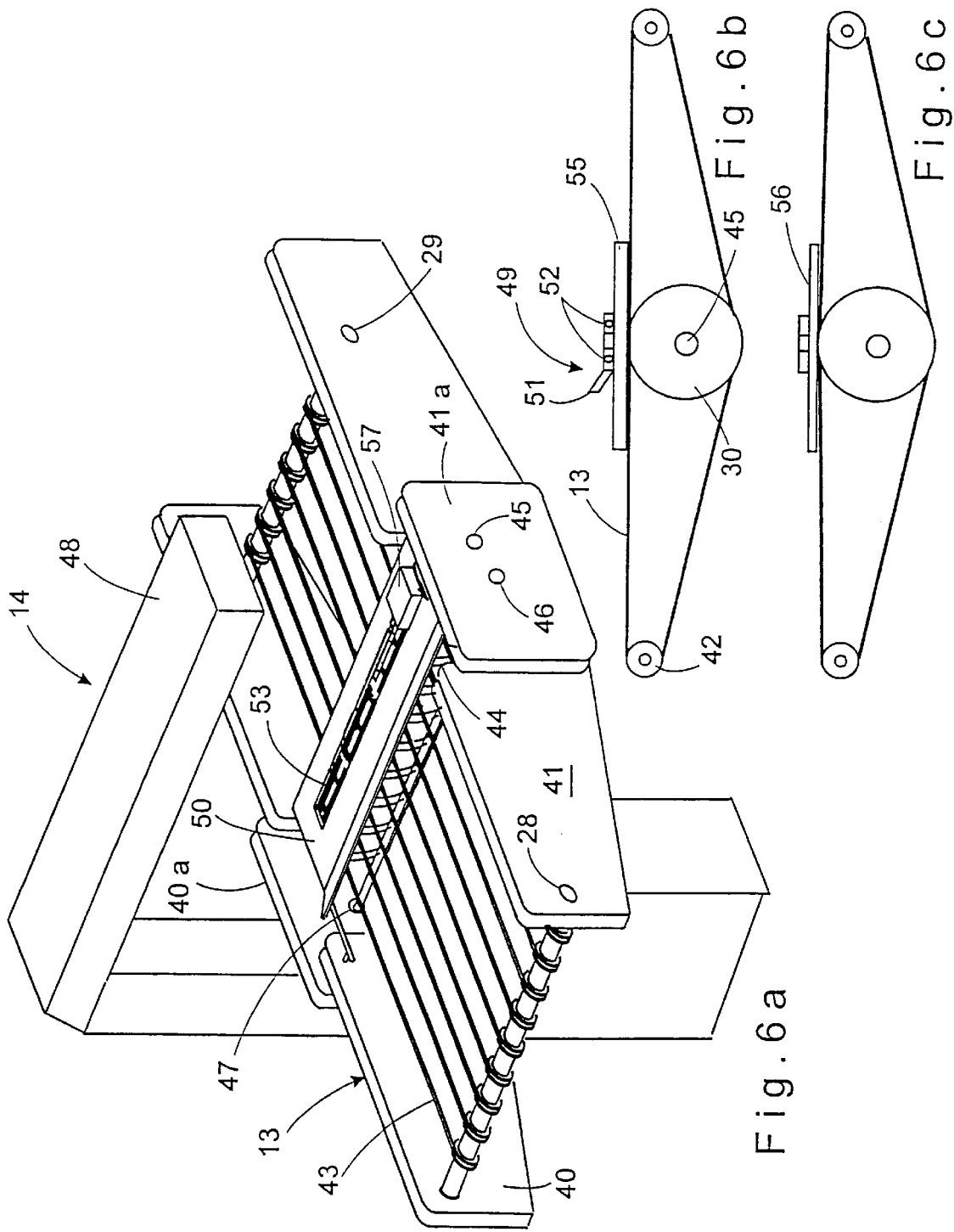

METHOD AND SYSTEM FOR CONTINUOUSLY PROCESSING SUCCESSIVE WORKPIECES ALONG A PRODUCTION LINE

FIELD OF THE INVENTION

The present invention relates to a method for conveying flat workpieces to and through a processing machine and a conveying system therefor, which is particularly useful with a processing machine requiring a precise positioning of the workpiece during processing.

BACKGROUND OF THE INVENTION

Continuous mass production of various workpieces has required development of conveying systems capable of transporting a stream of workpieces from a supply stack to a return stack through a working station for processing operations, for example cutting, recording, inspecting, or the like. It is commonly a necessary condition for most processing operations that the workpiece be precisely positioned. Additionally, it is often the case that either the workpiece should be firmly retained in place on the working table during processing, or alternatively sliding movement of the workpiece relative to the surface of the table should be suitably guided.

However, providing a separate specially equipped working table and transferring the workpieces from the conveying system onto the working table imposes additional loading, positioning and unloading operations thus slowing down the production. Furthermore, the consequent additional manipulations may cause damage to the workpieces and requires additional equipment which occupies considerable floor space.

SUMMARY OF THE INVENTION

It is a principal object of the present invention to provide a conveying system enabling a stream of workpieces to be transported progressively whilst allowing for one of the workpieces to be processed without disturbance during the conveyance of other workpieces.

According to a broad aspect of the invention there is provided a system for continuously processing successive workpieces along a production line having a loading means for loading workpieces onto a conveying means for conveying through a processing means and an unloading means for unloading a processed workpiece, characterized in that:
  (a) a feed means independent of the conveying means receives a workpiece from the loading means without disturbing the conveying means, and
  (b) a transfer means is provided for transferring the operational workpiece from the feed means to the conveying means prior to processing of the workpiece, and
  (c) the unloading means is coupled to the conveying means for unloading the operational workpiece from the conveying means after processing so as to allow subsequent unloading without disturbing the conveying means.

The unloading means may be a working table of a further processing station and/or may be also provided with one or more conveying mechanisms.

More specifically, the invention is useful in conjunction with a station for optical inspection of printed circuit boards (PCBs) having an artwork thereon and is therefore described below with respect to this application. Preferably, in such an embodiment, the conveying means is driven by a drum which itself functions as a support surface for supporting the PCB during optical inspection.

BRIEF DESCRIPTION OF THE DRAWINGS

These and other features and advantages of the present invention will become apparent from the ensuing detailed description of the preferred embodiments, given by way of example only, when taken in conjunction with the drawings, in which:

FIGS. 4a to 4h show schematically a conveying system in accordance with a second embodiment of the present invention during successive operational phases;

FIG. 6a shows schematically a perspective view of a detail of a conveying system constructed in accordance with the second embodiment of the present invention and having a main conveyor;

FIGS. 6b and 6c show schematically details of a cross-section taken through the line A—A in FIG. 6a;

FIG. 7a shows a detail of the main conveyor illustrated in FIG. 4a;

FIGS. 7b and 7c show schematically operative and inoperative positions of an elevation mechanism for use with a support platform of the main conveyor illustrated in FIG. 7a;

DETAILED DESCRIPTION OF PREFERRED EMBODIMENTS

Figure 1A:
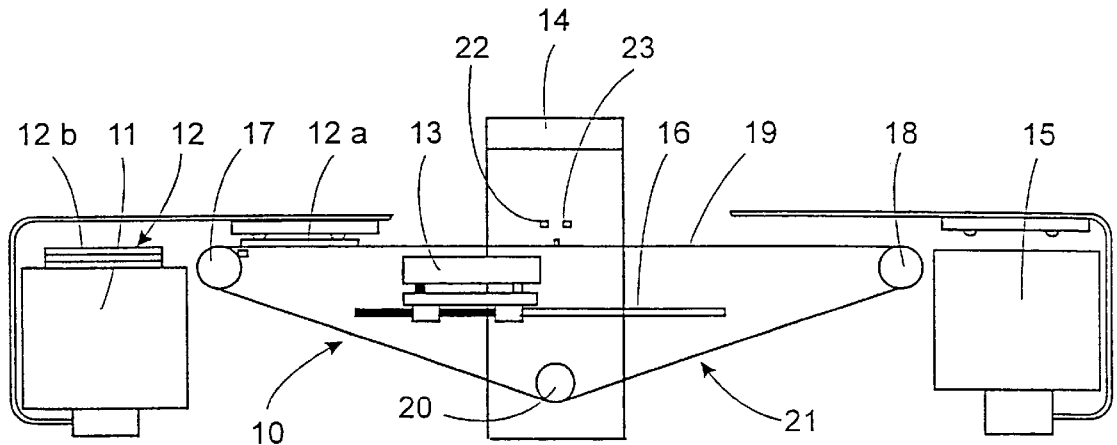
FIGS. 1a to 1f show schematically a conveying system in accordance with a first embodiment of the present invention during successive operational phases.

FIGS. 1a to 1f show successive stages in a conveying system designated generally as 10 according to a first embodiment of the invention. The conveying system 10 comprises a loader 11 (constituting a loading means) for loading an uppermost PCB 12a in a stack of PCBs 12 (constituting workpieces) onto a conveyor 13 (constituting a conveying means) for conveying the PCB 12a through an inspection station 14 (constituting a processing means). After inspection by the inspection system 14, the inspected PCBs are then transferred to an unloader 15 (constituting an unloading means) from which they may, if desired, be transferred to another processing system (not shown) downstream of the inspection system 14 for further processing.

In the embodiment shown in FIGS. 1a to 1f of the drawings, the conveyor 13 is in the form of a carriage adapted for translational movement along a guide rail 16 and also adapted for vertical up and down movement for reasons which will become apparent in the following description.

Disposed upstream and downstream of the inspection system 14 are rollers 17 and 18 for supporting a conveyor belt 19 which is further supported at a lower midpoint thereof by a third roller 20. The conveyor belt 19 in combination with the rollers 17, 18 and 20 constitute a feeder 21 for feeding the PCB 12a to the conveyor 13 prior to inspection thereof and for feeding the inspected PCB to the unloader 15 after inspection thereof. In order to determine when a PCB on the conveyor 13 has reached the inspection station 14 and also when it has completely passed therethrough, there are provided a pair of sensors 22 and 23 which respectively detect when a leading edge of the PCB 12a on the conveyor 13 has reached the inspection system 14 and when a trailing edge of the PCB 12a on the conveyor 13 has passed therethrough.

Figure 1B:
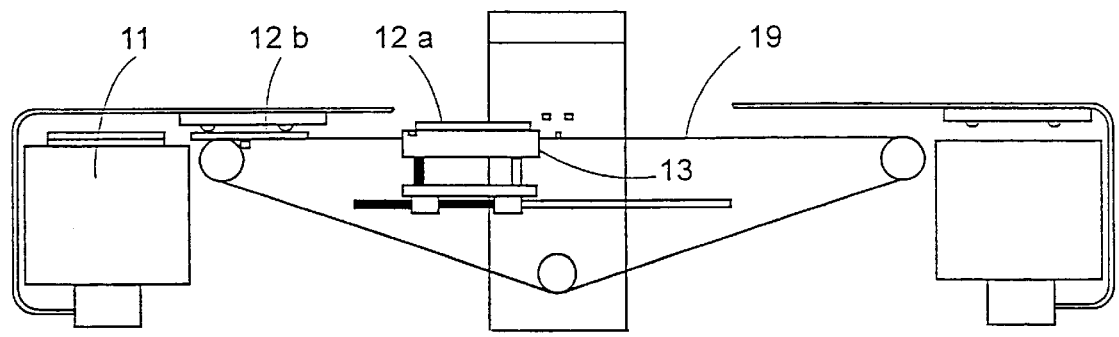
Figure 1C:
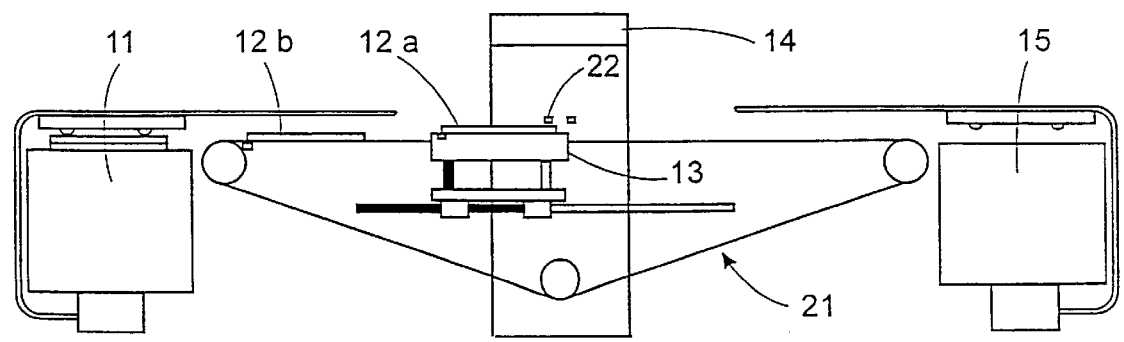
Figure 1D:
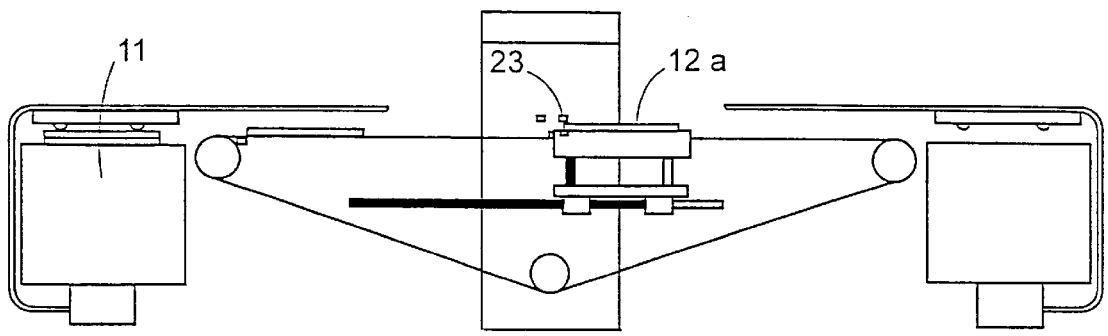
Figure 1E:
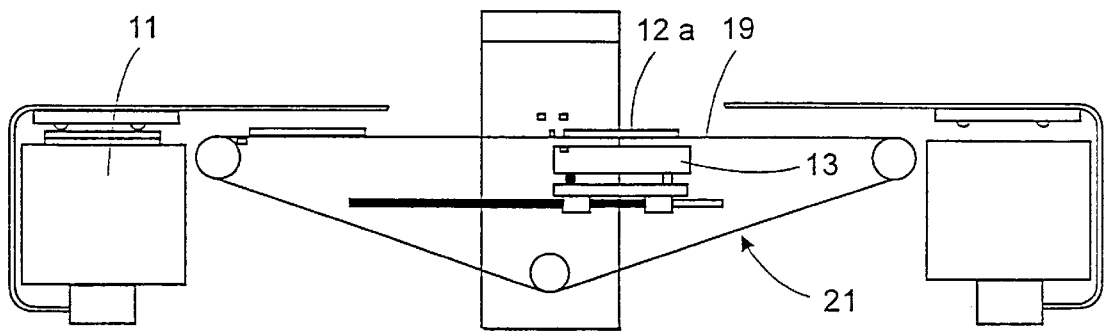
Figure 1F:
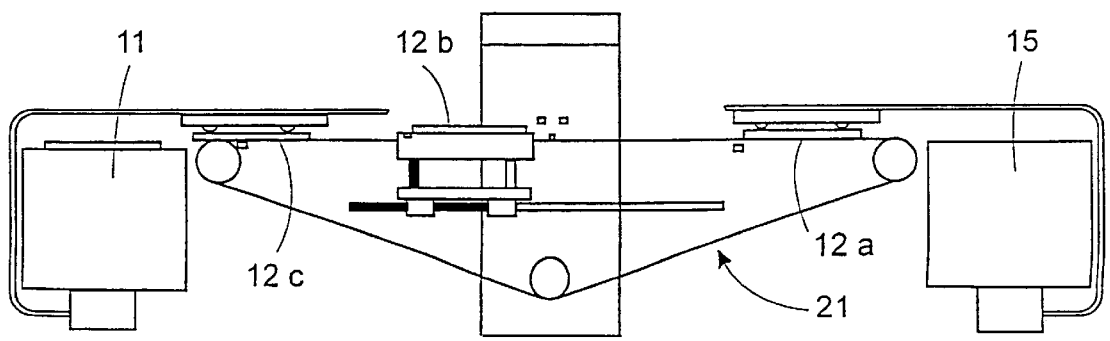
Figure 2A:
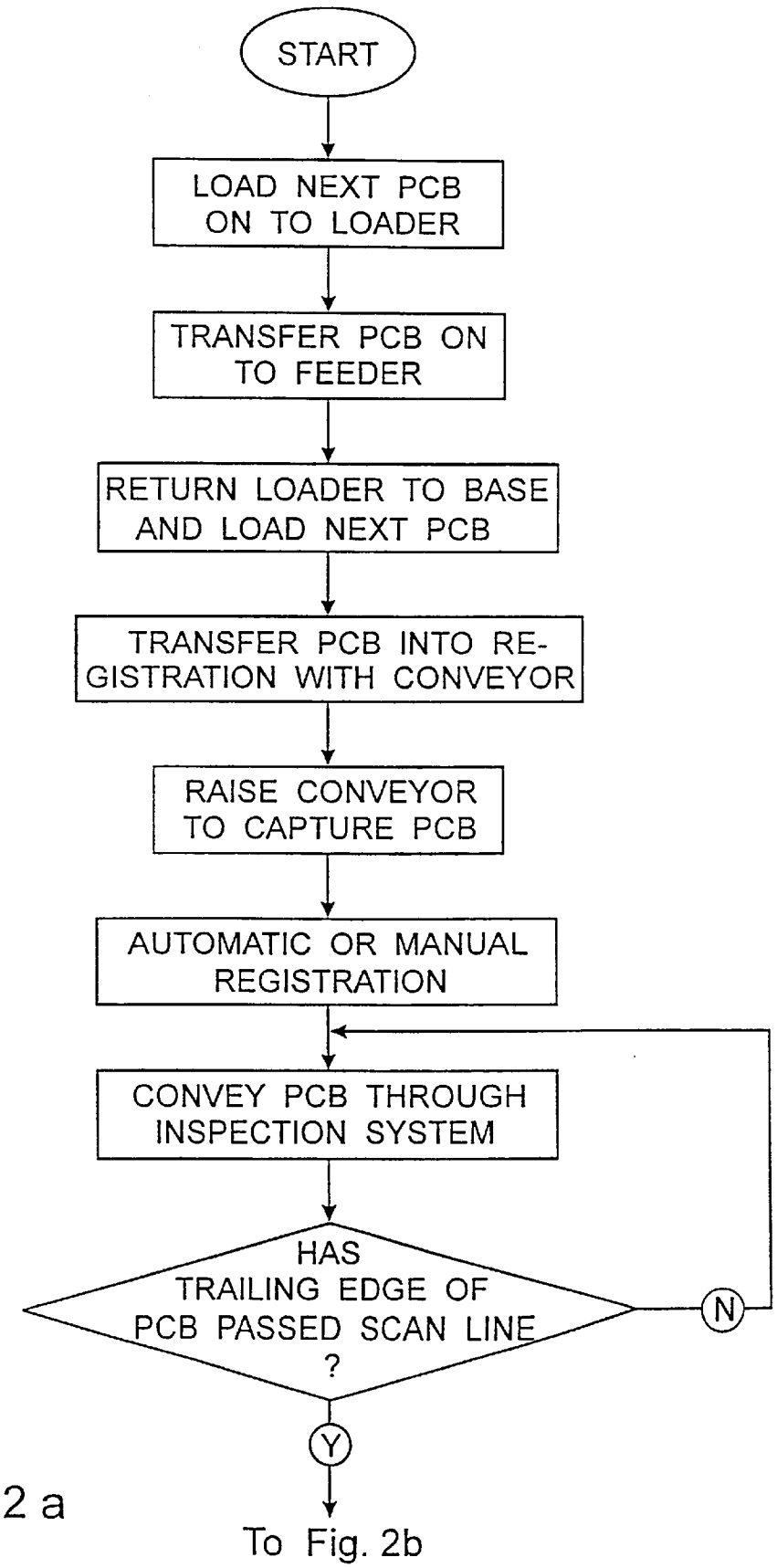
FIGS. 2a and 2b are a flow diagram showing the principal steps for operating the system illustrated in FIGS. 1a to 1f.
Figure 2B:
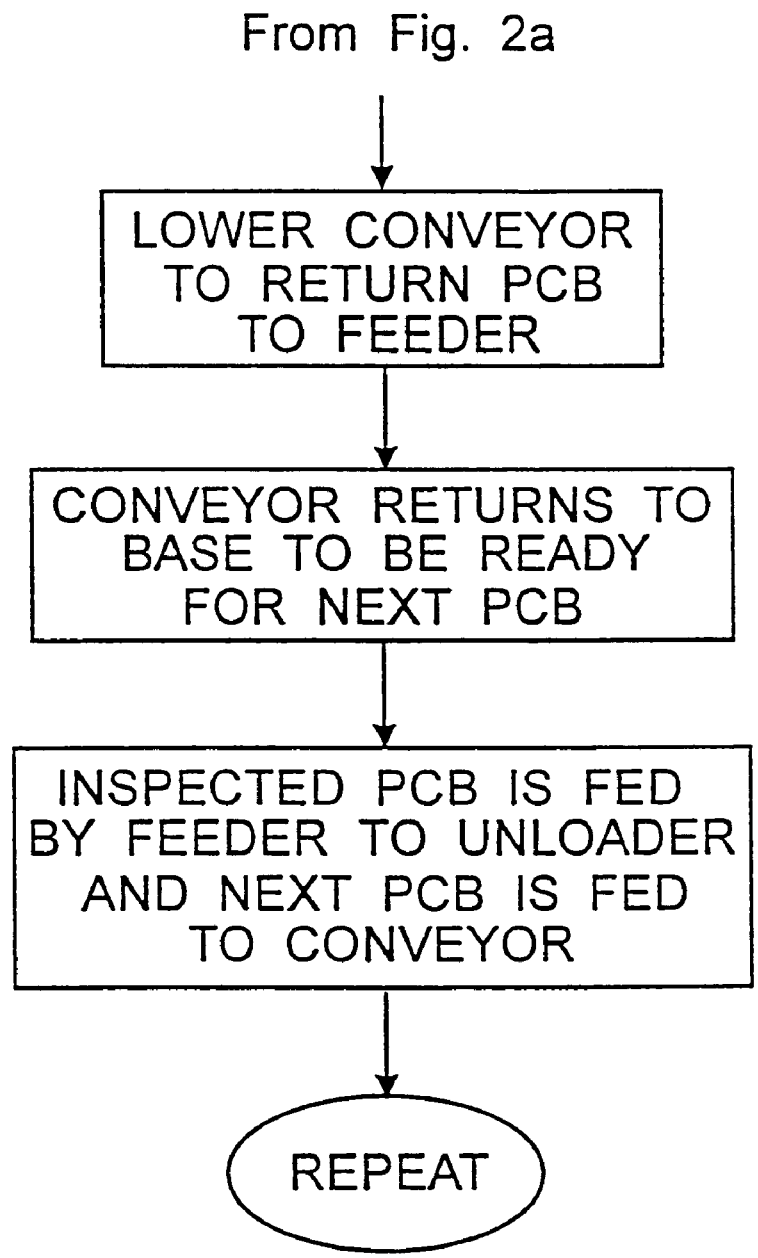

FIGS. 2a and 2b are a flow diagram showing the principal operating steps of the system 10 which will now be described with particular reference to the various stages of operation thereof shown in FIGS. 1a to 1f of the drawings. FIG. 1a shows a first stage of operation wherein a first, topmost PCB 12a in a stack of PCBs 12 is extracted by the loader 11 and is transported by the loader 11 to the conveyor belt 19 of the feeder 21. Rotation of the rollers 17 and 18 in a clockwise direction transports the conveyor belt 19 thereby feeding the first PCB 12a towards the inspection system 14. During this operation, the area on the conveyor belt 19 where the first PCB 12a was fed by the loader 11 is now freed so as to be able to accommodate a second, successive PCB 12b from the stack 12. Therefore, the carriage of the loader 11 is now returned to base (i.e. its initial loading position) so as to extract the second PCB 12b from the stack 12 and this is then placed on the conveyor belt 19 as shown in FIG. 1b of the drawings. Whilst this happens, the first PCB 12a is brought into registration with the conveyor 13. At this point, the conveyor 13 is lifted so as to lift the first PCB 12a from the conveyor belt 19 in the feeder 21 to the conveyor 13. Thus, the first, topmost PCB 12a is located on the conveyor 13 whilst a second, successive PCB is accommodated on the feeder 19.

Each of the operating steps is shown sequentially in FIGS. 1a to 1f of the drawings. Thus, in FIG. 1a, the first PCB 12a has just been placed on the feeder 21 whilst the conveyor 13 downstream of the first PCB 12a is in its low position.

FIG. 1b depicts the next stage of operation when the feeder 21 has brought the first PCB 12a into overlapping registration with the conveyor 13 and the second, successive PCB 12b has been placed by the loader 11 onto the feeder 21. Whilst in this position, the conveyor 13 is then raised so as to lift the first PCB 12a from off the conveyor belt 19 onto the carriage constituting the conveyor 13.

In FIG. 1c, the second, succeeding PCB 12b remains at the end of the feeder 21 upstream of the inspection station 14, whilst the conveyor 13 starts to move towards the unloader 15. During such movement of the conveyor 13, the feeder 21 being physically separate from the conveyor 13 does not impart any disturbance to the conveyor 13 which might impair the inspection process. Movement of the feeder 21 is inhibited during translation of the conveyor 13 from the position shown in FIG. 1c so as to allow the first PCB 12a to complete inspection, whereupon the conveyor 13 is returned to the feeder 21 to acquire the next PCB 12b. If the feeder 21 were not inhibited in such manner, then the next PCB 12b would be conveyed towards the conveyor 13 and would possibly either collide with the carriage of the conveyor 13 which is at this stage in its elevated position thus protruding above the feeder 21; or alternatively might be conveyed beyond the point from which it is to be transferred from the belt of the feeder 21 onto the carriage of the conveyor 13. In order to avoid such possibility, the feeder 21 is inhibited from the moment the leading edge of the first PCB 12a on the conveyor 13 is aligned with the sensor 22 and up to the position shown in FIG. 1d wherein a trailing edge of the PCB 12a is aligned with the sensor 23.

At this point, as shown in FIG. 1e, the conveyor 13 is lowered whereupon the first PCB 12a is released onto the conveyor belt 19 of the feeder 21 whereupon, as shown in FIG. 1f, the conveyor 21 is re-started so as to conveyor the first PCB 12a towards the unloader 15 whilst bringing the second, successive PCB 12b into overlapping relationship with the conveyor 13. The upstream end of the conveyor 21 having been thus vacated, the third, successive PCB 12c is now loaded by the loader 11 onto the feeder 21 and the whole cycle is repeated.

Figure 3:
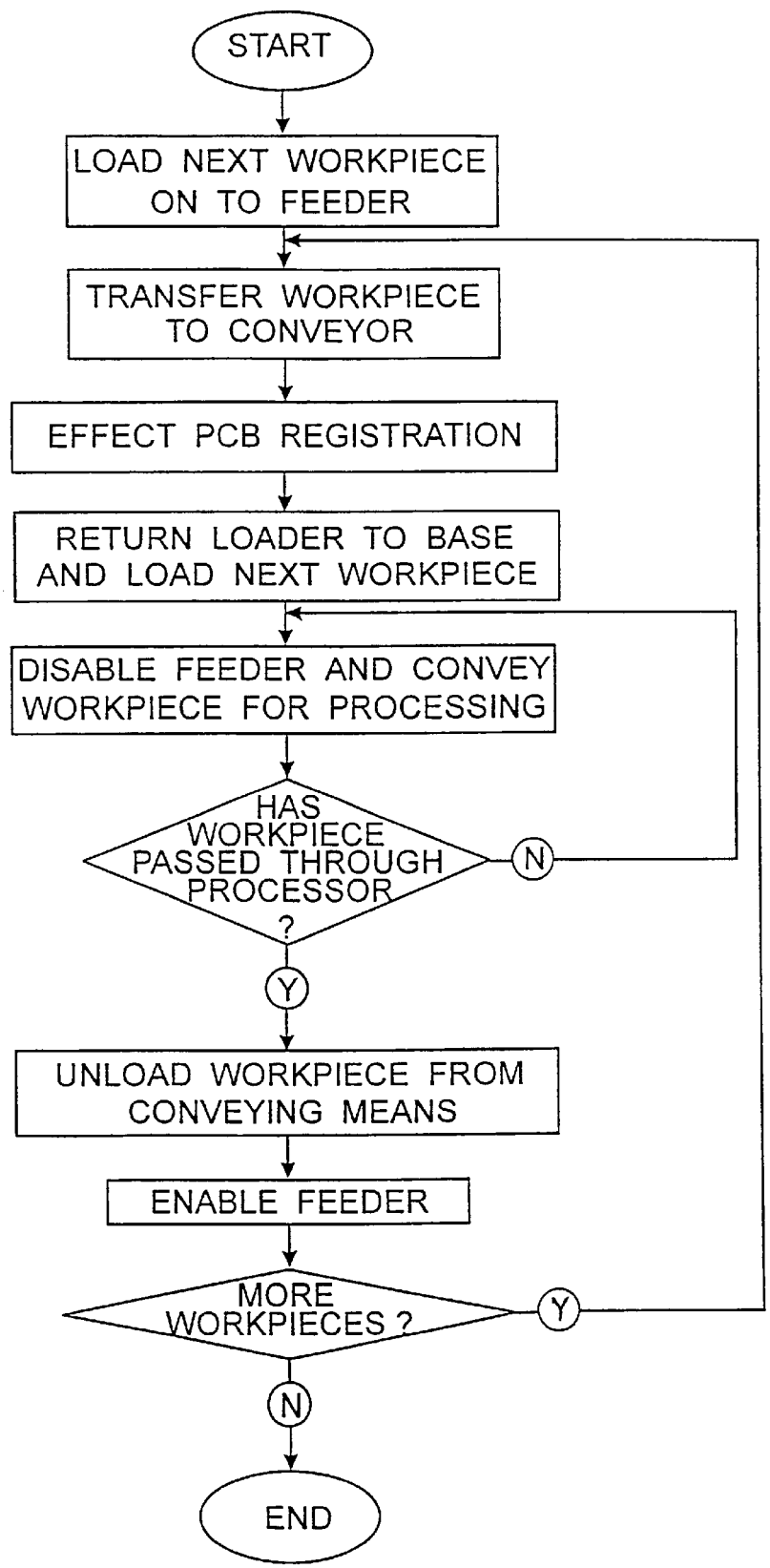
FIG. 3 is a simplified flow diagram showing fundamental operating principles of the invention.

FIG. 3 shows the principal operating steps which define the essential features of the invention and which are common to all embodiments thereof. Thus, successive workpieces are loaded onto a feeder whereupon workpieces are successively transferred to a conveyor. At the same time, or shortly thereafter, the loader returns to base for loading the next workpiece. The feeder is now disabled and the workpiece on the conveyor is conveyed for processing. After processing, the processed workpiece is transferred back to the feeder which is now enabled and the cycle repeated, as required.

FIGS. 4a to 4h show successive stages in a conveying apparatus designated generally as 25 according to a second embodiment of the invention. Those components of the apparatus 25 which are common to all embodiments will, for the sake of consistency, be identified by the same reference numerals. Thus, the apparatus 25 comprises a loader 11 for loading an uppermost PCB 12a in a stack of PCBs 12 onto a conveyor 13 for conveying the PCB 12a through an inspection station 14. After inspection, the inspected PCBs are then transferred to an unloader 15 which unloads the PCBs from the conveyor 13 for onward transfer to a downstream marking station 26 whereupon the marked PCBs are then transferred to a collection station 27. The conveyor 13 comprises freely rotatable rollers 28 and 29, the conveyor 13 itself being driven by means of a central drum 30 operated by a suitable drive means (not shown) connected to an operating shaft thereof.

The unloader shown generally as 15 also comprises a conveyor belt 31 which is supported at opposite ends thereof by rollers 32 and 33. Likewise, a third conveyor 34 is supported at opposite ends thereof by respective rollers 35 and 36 for conveying an inspected PCB from the unloader 15 through the marking station 26 and onto the collection station 27. Associated with the feeder 21 is a sensor 37 for detecting when a PCB on the conveyor 13 has completely cleared the feeder 21, thus permitting the feeder 21 to receive a successive PCB from the loader 11.

As will be explained in greater detail below, the unloader 15 is adapted for tilting movement such that the upstream roller 32 thereof may be raised above the level of the conveyor 13. By such means, as will be explained with particular reference to FIG. 4f of the drawings, a PCB on the conveyor 13 may be transferred to the unloader 15.

Figure 4A:
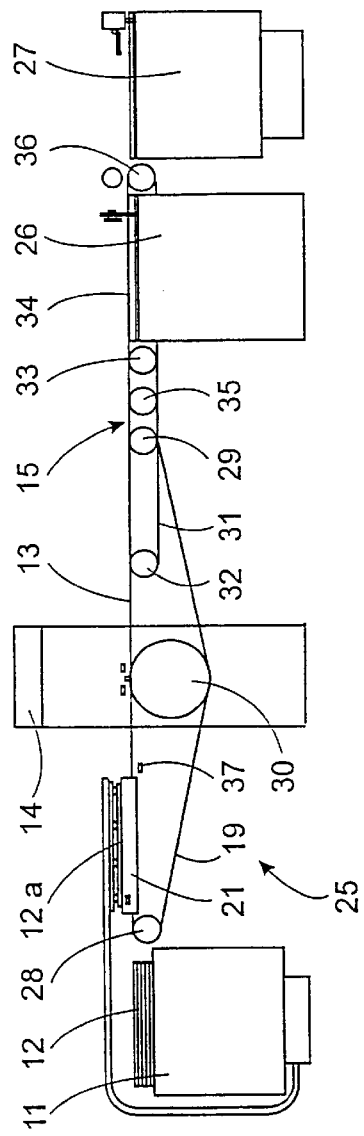
Figure 4B:
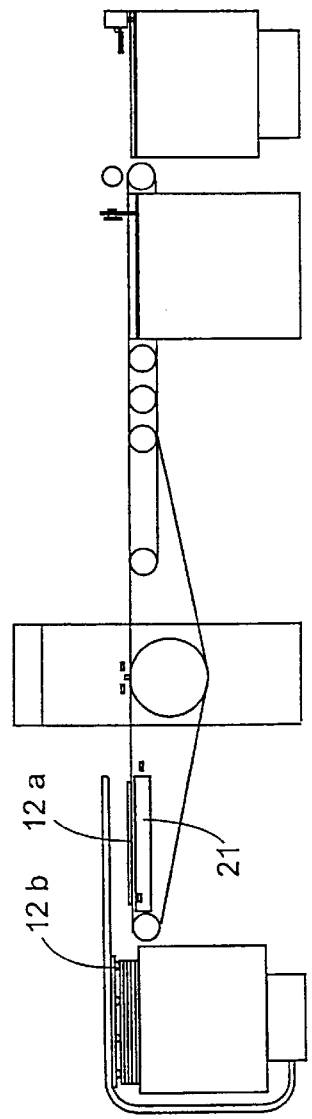
Figure 4C:
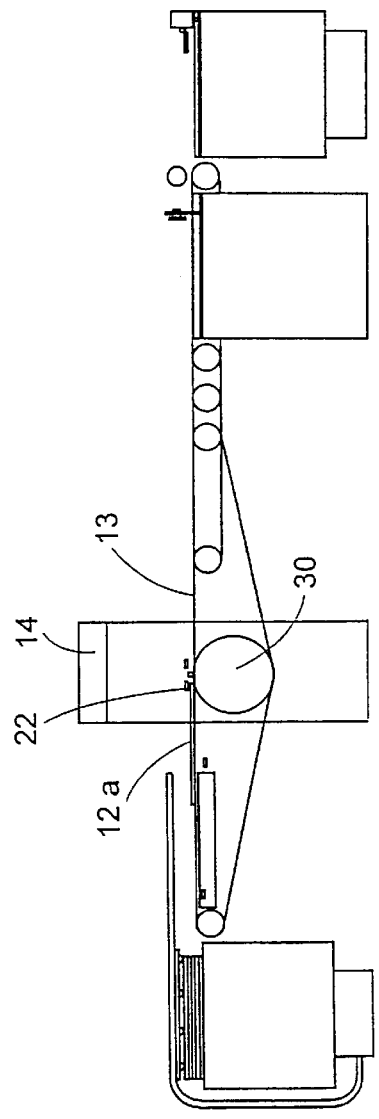
Figure 4H:
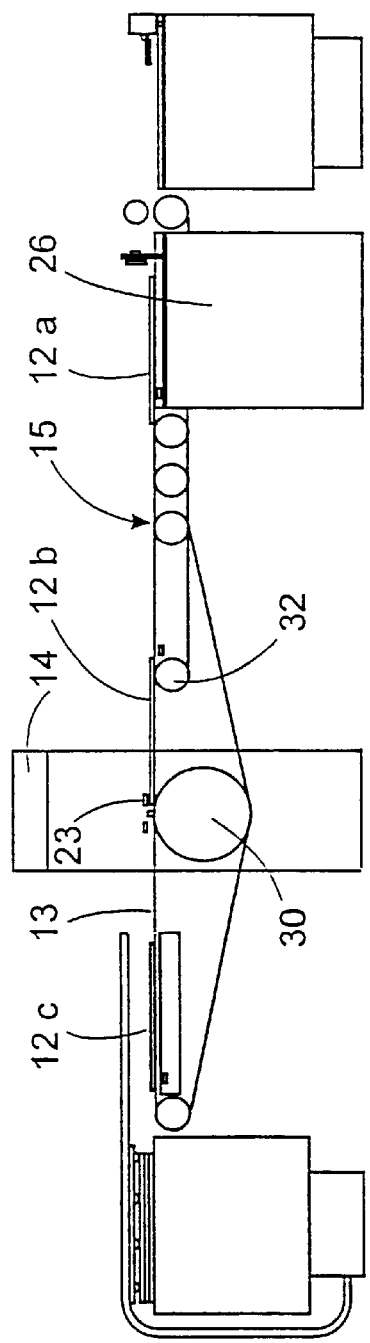
Figure 4G:
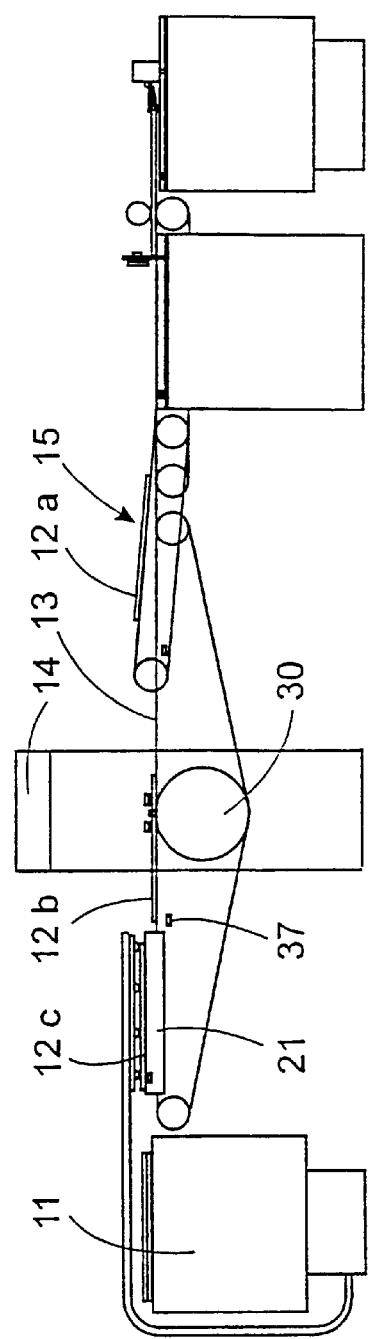
Figure 5A:
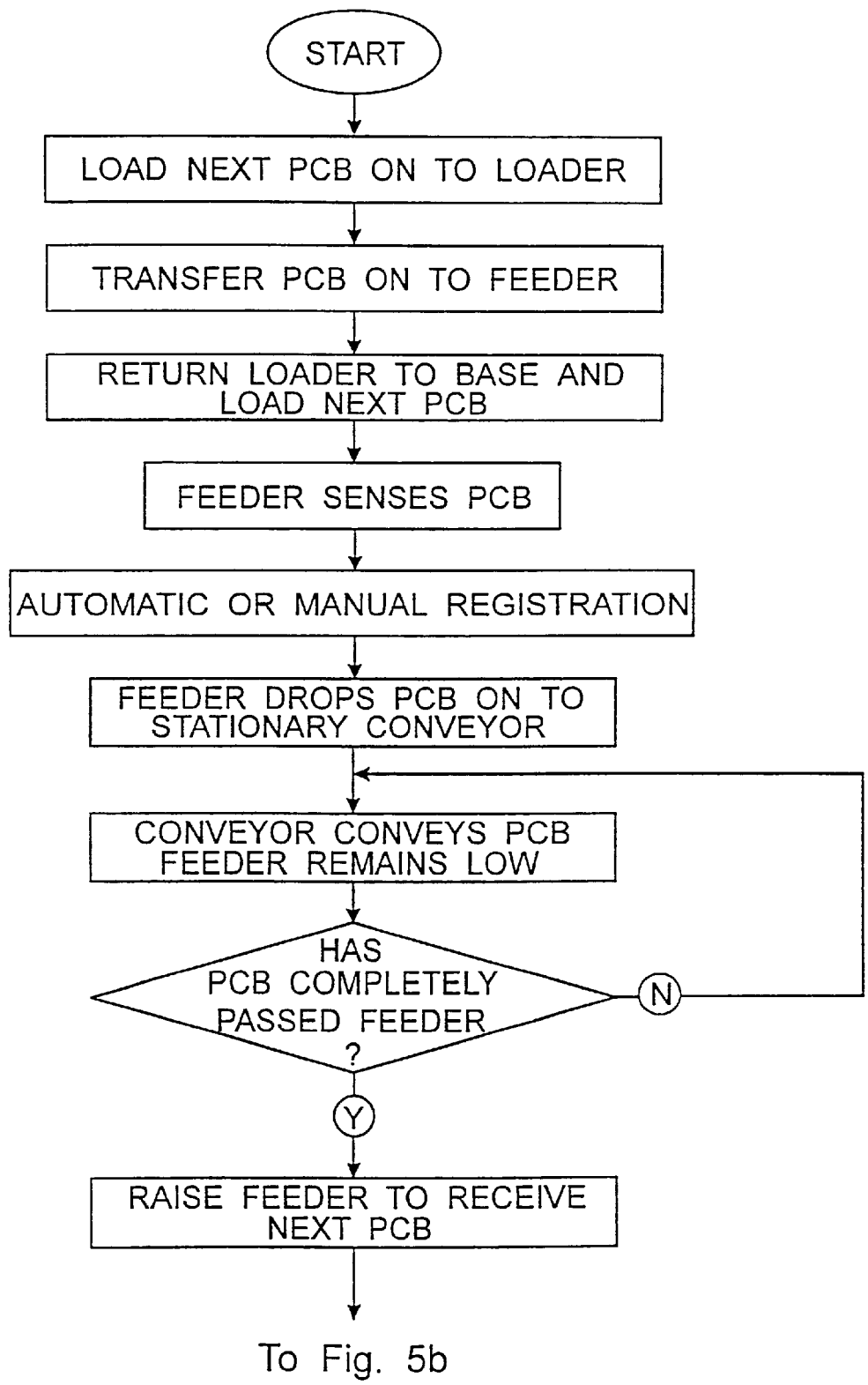
FIG. 5 is a flow diagram showing the principal steps for operating the system illustrated in FIGS. 4a to 4h.
Figure 5B:
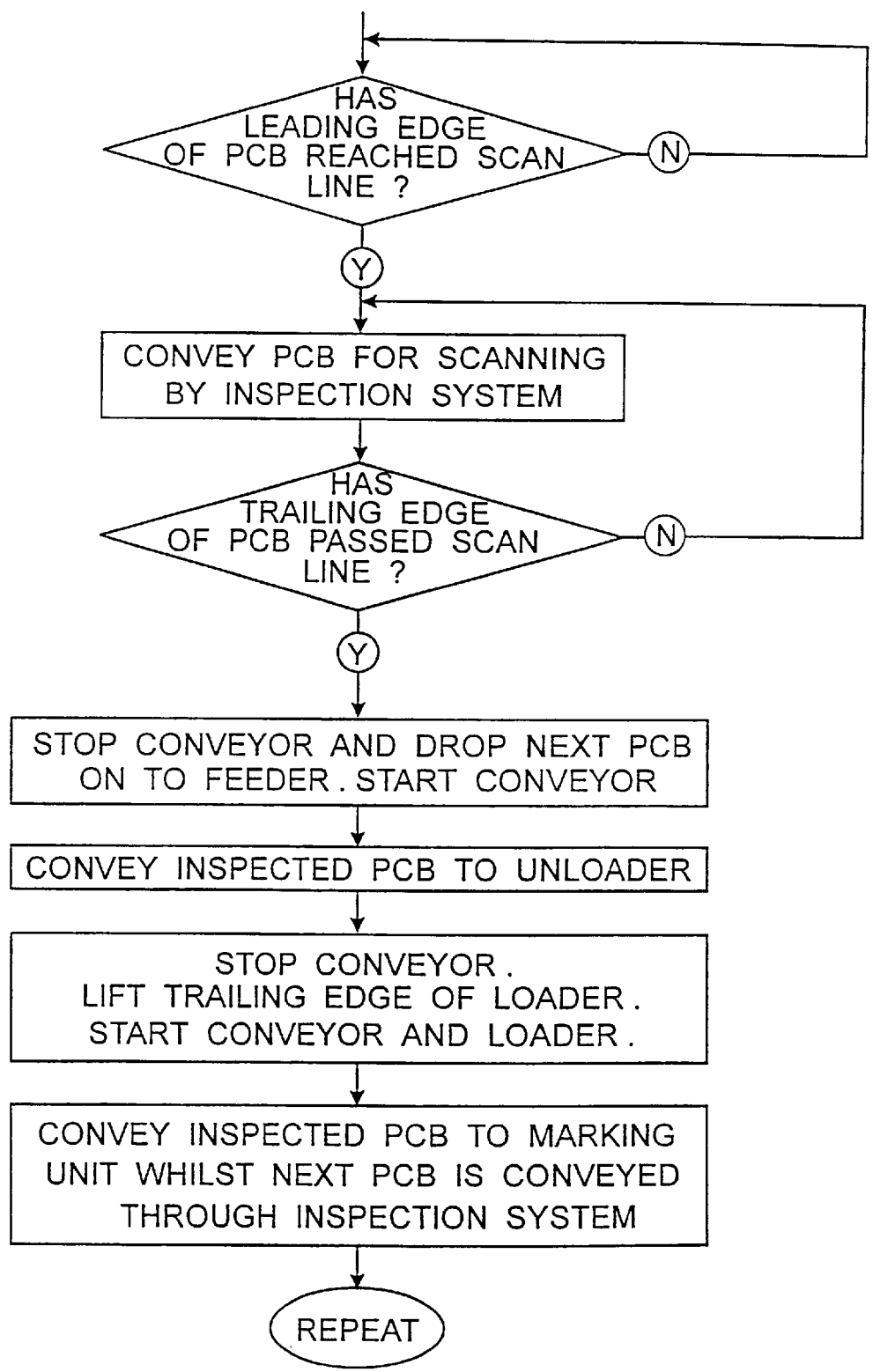

FIGS. 5a and 5b are a flow diagram showing the principal operating steps of the system 25 which will now be described with particular reference to the various stages of operation thereof shown in FIGS. 4a to 4h of the drawings. In order to avoid any possibility of confusion with the first embodiment shown in FIGS. 1a to 1f of the drawings, it is to be noted at the outset that the conveyor belt supported on the rollers 28 and 29 constitutes the conveyor 13 whilst the feeder, also shown as 21 for consistency with the embodiment, is a platform adapted for up and down vertical movement so as to lift a PCB from off the conveyor 13; or, alternatively, to drop a PCB thereon, as required.

Operation of the system 25 is as follows. Initially, the feeder 21 is in an elevated position as shown in FIG. 4a and the loader 11 loads a first, topmost PCB 12a from the stack of PCBs 12 onto an upper surface of the feeder 21. As shown in FIG. 4b, the feeder 21 is now lowered so that its upper surface is beneath an upper surface of the conveyor 13, whereupon the first PCB 12a is transferred from the feeder 21 to the conveyor 13. During this operation, the loader 11 is returned to base so as to load the second, successive PCB 12b. The PCB 12a is pre-registered with the conveyor 13 whilst still on the feeder 21 so that it maintains the correct registration upon being deposited onto the conveyor 13. By such means, the need for separate registration of the PCB 12a whilst on the conveyor 13 is avoided.

As shown in FIG. 4c, the conveyor 13 is now driven by the drum 30 so as to convey the first PCB 12a towards the inspection station 14 until a leading edge of the PCB 12a reaches the first sensor 22.

As shown in FIG. 4d, further motion of the conveyor 13 conveys the first PCB 12a through the inspection station 14 and, in so doing, evacuates the feeder 21. The empty feeder 21 is now raised as shown in FIG. 4d so as to receive the second, successive PCB 12b, during which time the conveyor 13 is disabled so that movement of the feeder 21 causes no disturbance to the first PCB 12a passing through the inspection station 14.

As shown in FIG. 4e, the drum 30 is now rotated so as to transport the first PCB 12a through the inspection station 14 along the conveyor 13 until the trailing edge of the PCB 12a reaches the sensor 23, thus indicating that inspection has been completed. The relationship between the length of the PCB 12a and the distance between the drum 30 and the upstream roller 32 of the unloader 15 is such that the leading edge of the PCB 12a at least slightly overlaps the upstream roller 32. The feeder 21 is now lowered so as to transfer the second, successive PCB 12b onto the conveyor 13 for conveying through the inspection station 14.

As shown in FIG. 4f, the second, successive PCB 12b is conveyed towards the inspection station 14: this continuing until the leading edge of the second PCB 12b reaches the sensor 22. The conveyor 13 is now disabled so that the second, successive PCB 12b remains stationary and the upstream roller 32 of the unloader 15 is tilted so that the upstream roller 32 is elevated, whereby further rotation of the upstream roller 32 causes the first PCB 12a to be unloaded without disturbing the conveyor 13 since is physically separate therefrom.

As shown in FIG. 4g, whilst the first PCB 12a is being thus unloaded by the unloader 15, the drum 30 is now re-started so as to enable the conveyor thereby conveying the second PCB 12b through the inspection station 14 until the trailing edge thereof clears the feeder 21 as shown by the sensor 37. Thereupon the feeder 21 is raised so as to receive a third, successive PCB 12c from the loader 11.

Finally, as shown in FIG. 4h, the feeder 21 is lowered so as to transfer the third, successive PCB 12c onto the conveyor 13; the upstream roller 32 of the unloader 15 is lowered into its normal operating position and the drum 30 is driven so as to enable the conveyor 13. The conveyor 13 now conveys the first PCB 12a onto the marking station 26 whilst, at the same time, the second PCB 12b is conveyed through the inspection station 14 and the third PCB 12c is partially conveyed towards the inspection station 14.

Having now described the system functionally, details thereof will now be described with particular reference to FIGS. 6a to 8c of the drawings.

FIG. 6a shows a detail of the conveyor 13 having a pair of side frames 40 and 41 supporting at opposite ends thereof rollers 28 and 29 each supporting at spaced apart intervals pulleys 42 for supporting respective conveyor belts 43. The belts 43 may be Round Belts PN DIA-7 (GREEN) commercially available from MULON Ltd. As noted above, the conveyor belts 43 are supported at opposite ends by the rollers 28 and 29 and are supported, under tension, at a mid-location thereof by the drum 30. The drum 30 is itself supported within opposite side frames 40a and 41b which are independent of the side frames 40 and 41 of the conveyor 13. An outer surface of the drum 30 is formed with a plurality of spaced apart parallel circumferential recesses 44 for slidably accommodating therein respective ones of the conveyors belts 43. By such means, the drum 30 not only conveys the PCB 12a through the inspection station 14, but also acts as a supporting surface for supporting thereon each PCB 12a during inspection. Preferably, the outer surface of the drum 30 is provided with a rubber coating so as to increase friction between the supporting surface of the drum 30 and the PCB 12a and thus prevent movement of the PCB 12a during inspection.

The drum is driven via a central drive shaft 45 directly coupled to a motor, such as Direct Drive Torque Motor TM 5125V-148-031 commercially available from Verwitron Ltd., U.S.A. The rotation of the drum 45 is controlled by an encoder, such as Rotary Laser Encoder R-11 commercially available from Canon Europe NV. In addition to the central drive shaft 45 of the drum 30, there is also provided an eccentric drive 46 which is eccentrically mounted in bearings 47 supported within the respective side frames 40a and 41a so as to allow the drum 30 to be vertically displaced within the side frames 40a and 41a so as thereby to raise the upper surface of the PCB 12a during inspection and thus ensure that its distance from an optical imager shown generally as 48 is maintained. By such means, accurate focus of the upper surface of the inspected PCB 12a may be maintained regardless of variations in the thickness of the PCB 12a which can range from 0.05 mm to 5 mm.

The PCB 12a being inspected is guided through the inspection system 14 by means of a guiding mechanism shown generally as 49 in the form of a cover 50 whose leading edge 51 is slightly upraised so as to allow an advancing PCB to pass underneath the raised leading edge 51 and thus ensure its unimpeded passage through the inspection system 14. To aid passage of the PCB through the guiding mechanism 49, there is provided a pair of freely rotatable roller bearings 52 for providing rolling contact with an upper surface of the PCB. The cover 50 is provided with an elongated aperture 53 defining a scan line directly beneath the imaging optics 48.

The operation of the guiding mechanism 49 is shown schematically in FIGS. 6b and 6c of the drawings in respect of PCBs 55 and 56 having different widths. In operation, the drum 30 is lowered before the PCB 55 or 56 reaches the guiding mechanism 49 so as to provide adequate clearance between the guiding mechanism 49 and the upper supporting surface of the drum 30 regardless of the thickness of the PCB. The PCB 55 or 56 passes under the upraised leading edge 51 of the guiding mechanism 49 whereupon the drum 30 is raised until the PCB 55 or 56 is properly supported on the upper surface of the drum 30 beneath the cover 50 with the upper surface of the PCB 55 or 56 substantially co-planar with a lower surface of the cover 50. In order to guard against the possibility, during production, that the leading edge of a PCB might escape through the aperture 53 of the cover 50, there is provided an alarm sensor 57 at one end of the elongated aperture 53 for detecting a PCB located on top of the cover 50 and providing a suitable alarm signal. The alarm sensor 57 may be, for example, an optical sensor such as FZ5IL Sensor Through-Beam Transmitter & Receiver commercially available from Keyence Lead Electric Corp. Construction and operation of the alarm sensor 57 are not in themselves features of the present invention and are therefore not specifically described.

It will thus be clear that each of the PCBs in the stack 12 is conveyed by means of the conveyor belts 43 through the inspection system 14. As noted above, it is a principal feature of the invention that successive PCBs are placed onto the conveyor 13 in such a manner as not to cause vibrations of the conveyor 13 or any other disturbance thereto which might impair the accuracy of the optical inspection.

Figure 7A:
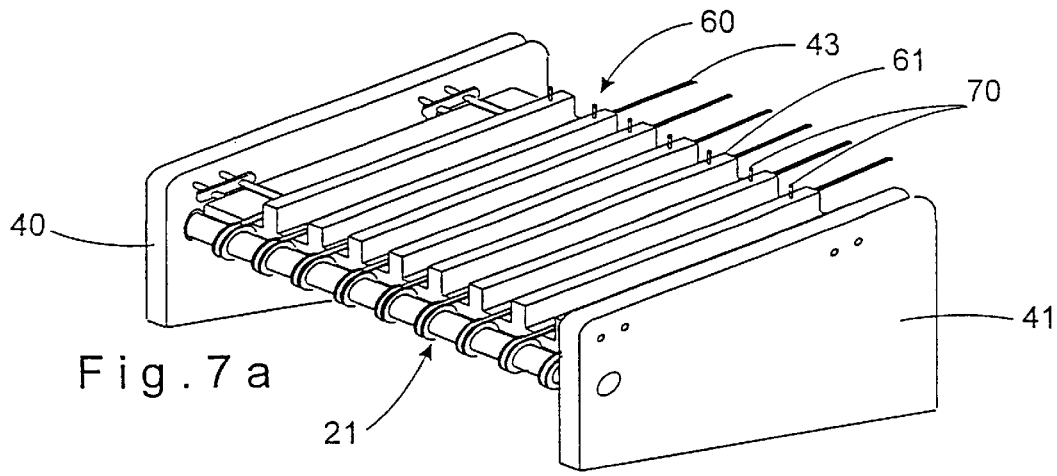
Figure 7B:
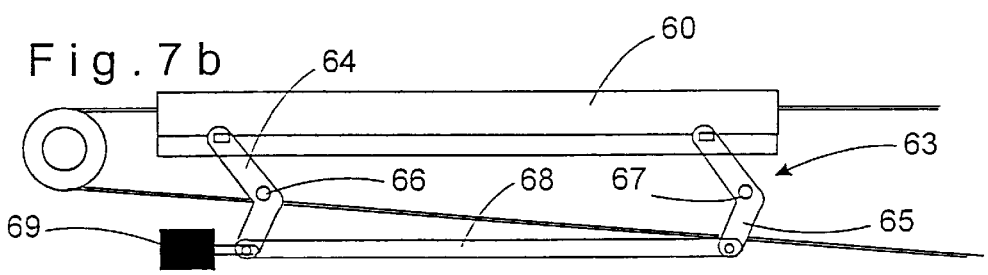

FIG. 7a is a pictorial representation of the feeder 21 which operates in conjunction with the conveyor 13 so as to allow the desired transfer of successive PCBs from the loader 11 to the conveyor 13. Thus, it is to be noted that the feeder 21 has a supporting surface shown generally as 60 in the form of spaced apart turrets 61 such that when the feeder 21 is in an elevated position (as shown in FIG. 7a) the turrets 61 are accommodated between adjacent conveyor belts 43. The feeder 21 is lowered and raised by means of a mechanical linkage 63 having upper and lower operating positions shown, respectively, in FIGS. 7b and 7c of the drawings.

Figure 7C:
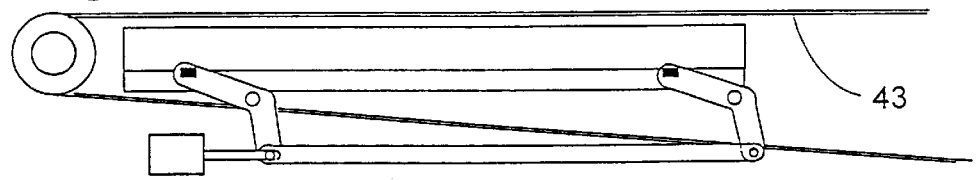

Thus, the linkage mechanism 63 comprises a pair of parallel links 64 and 65 hingedly supported on respective pivot axes 66 and 67 over which are mounted at opposite ends thereof within the side frames 40 and 41 of the feeder 21. Upper ends of the links 64 and 65 are hingedly connected to the support surface 60 of the feeder 21 whilst lower ends of the links 64 and 65 are hingedly connected to a strut 68 which is itself coupled to a piston 69 adapted for horizontal to-and-from movement of the strut 68 so as thereby to raise or lower the support surface 60 of the feeder 21, as required. Specifically, as noted in FIGS. 7a and 7b, when the feeder 21 is in its elevated position, the turrets 61 protrude through the gaps between adjacent conveyor belts 43. whilst in its lower position, as shown in FIG. 7c, the supporting surface 60 of the feeder 21 lies beneath the conveyor belts 43. Thus, a PCB is transferred from the loader 11 (FIG. 4a) to the conveyor 13 by first disposing the PCB onto the supporting surface 60 of the feeder 21 when the feeder 21 is in its elevated position; whereby, lowering the feeder 21 to the position shown in FIG. 7c, causes the PCB on the supporting surface 60 of the feeder 21 to be transferred to the conveyor belts 43 of the conveyor 13.

When such a system is used for the optical inspection of PCBs, it is normal to effect the optical inspection and subsequent marking in two distinct stages. As is known, during the first stage of optical inspection locations on the PCB which are seen either to be faulty or suspect are memorized and in the subsequent marking stage each of these locations is marked so as to permit subsequent manual inspection and, possibly, correction. Consequently, it is most important that the optical inspection system 14 and the marking station 26 are in correct registration. In practice, this is accomplished by ensuring that the PCB itself is in correct registration with both the inspection system 14 and the marking system 26. Such registration is accomplished by so controlling the passage of the PCB through the inspection system 14, that its leading edge is parallel to the scan line of the inspection station 14 whilst a side edge is maintained flush with an inner surface of the side frame 41. Such registration can be accomplished manually and, to this effect, there are provided registration pins 70 at a downstream end of the feeder 21 so that an operator can manually load the PCBs onto the feeder 21, when in its raised position, with the leading and side edges of the PCB respectively in contact with the registration pins 70 and the internal surface of the side frame 41.

Figure 8A:
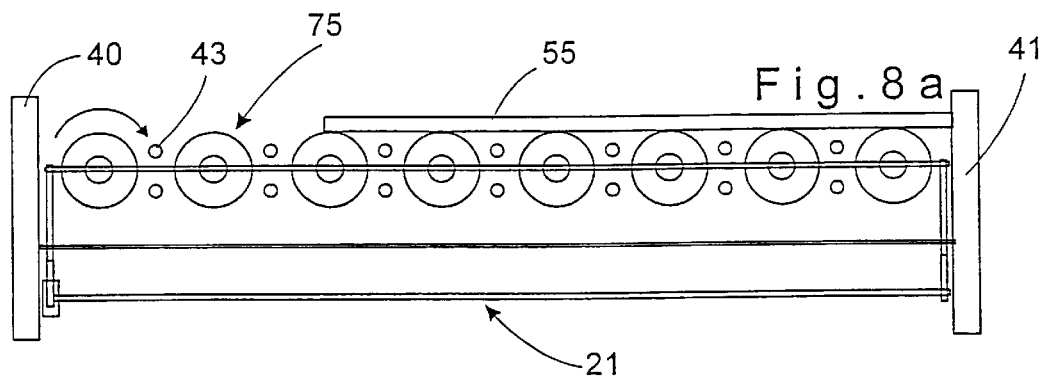
FIGS. 8a and 8b show the disposition of the workpiece relative to the main conveyor during. operative and inoperative positions of the elevation mechanism.
Figure 8B:
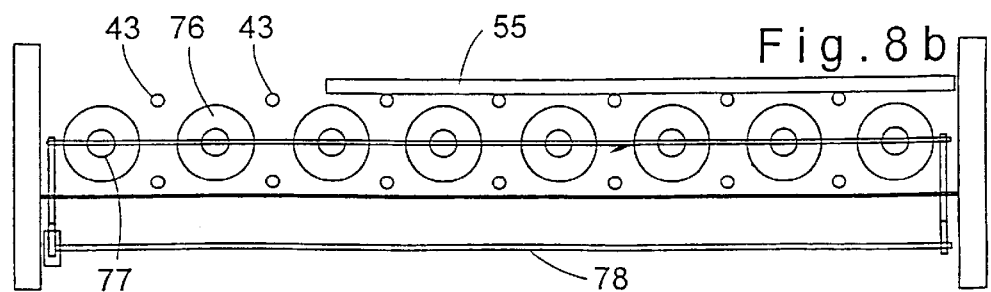

FIGS. 8a and 8b show schematically an end elevation of an alternative feeder 21 wherein the desired registration of the PCB 55 is effected automatically. As seen, the feeder 21 comprises a support surface depicted generally as 75 in the form of a plurality of spaced-apart rollers 76 disposed between adjacent conveyor belts 43. The rollers 76 are mounted on shafts 77 opposite ends of which are mounted within a support frame shown generally as 78 and which is operated by a suitable mechanism for raising and lowering into the positions shown in FIGS. 8(a) and 8(b), respectively. Thus, in operation, the rollers 76 are first raised into the position shown in FIG. 8(a) wherein the supporting surface 75 of the feeder 21, constituted by the upper surface of each of the rollers 75, is proud of the upper surface of the conveyer belts 43. The PCB 55 is then released onto the feeder 21 as explained above and the rollers 76 are rotated in a clockwise direction (as shown in the figure) save thereby to convey the PCB 55 laterally towards the side frame 41. This having been done, the frame 78 is lowered into the position shown in FIG. 8(b), wherein the supporting surface 75 of the feeder 21 is beneath the supporting surface of the conveyor belts 43. By such means, the PCB 55 is transferred from the feeder 21 to the conveyer 13.

Figure 9:
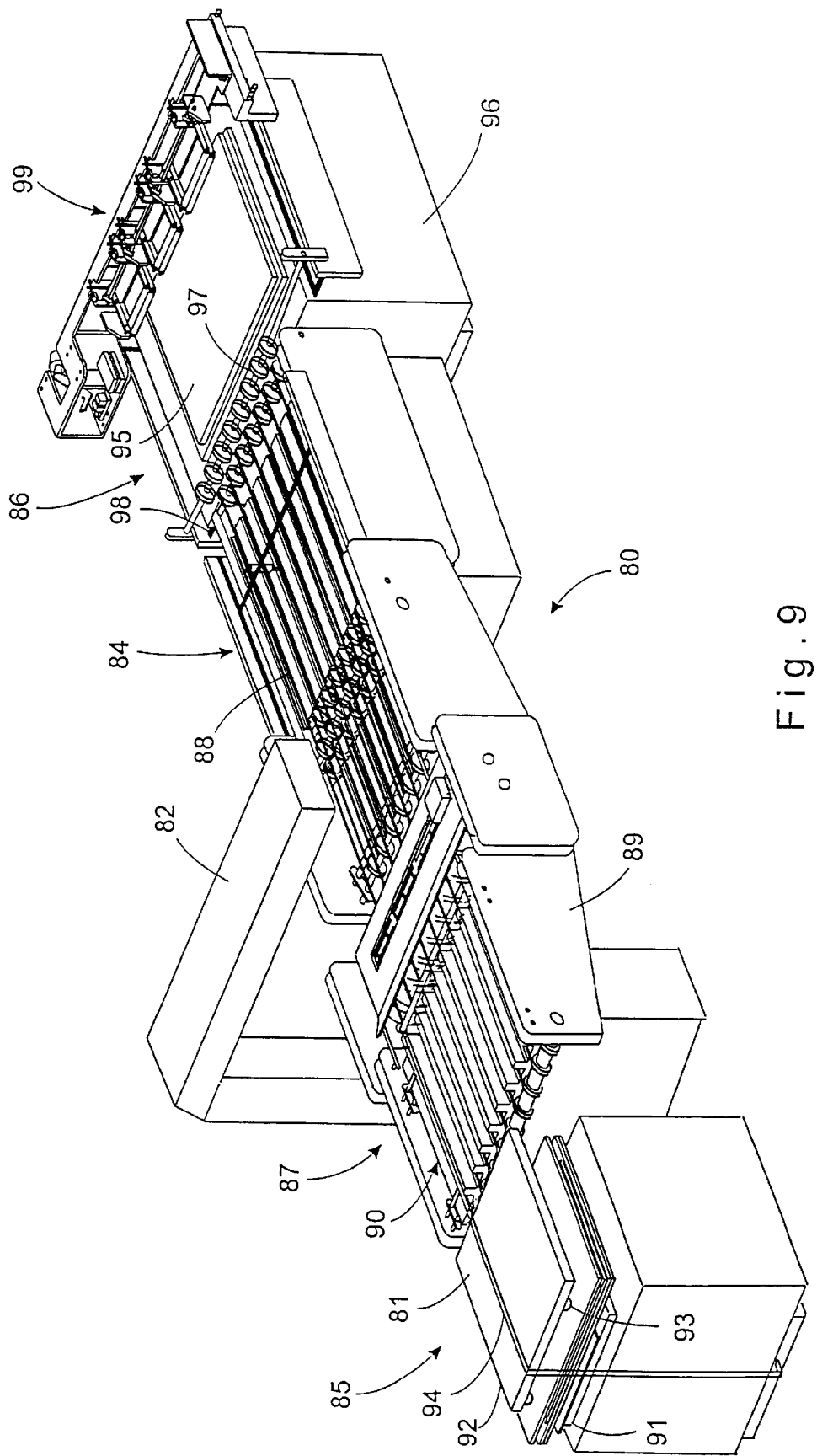
FIG. 9 is a pictorial representation of a PCB conveying system operating in accordance with the principles of the invention.

Referring now to FIG. 9 there is illustrated schematically a conveying system, generally designated 80, for conveying a stream of PCBs 81 to and through an optical inspection station 82, wherein a progressing PCB is processed without interrupting the flow of succeeding or preceding PCBs. The inspection station 82 allows for conventional inspection of PCBs using any of a number of conventional techniques for detecting flaws. Downstream of the inspection station 82 there is disposed an additional marking station 84 for marking locations of detected flaws, if any.

Since the inspection station 82 does not itself form a part of the present invention, details of its construction and operation are not set forth herein, except to note that PCBs 81 are inspected from above by suitable optical means adapted for scanning the PCB in order to locate defects. For example, a CCD Image Sensor LKI-6003 commercially available from Eastman Kodak Company may be employed.

The conveying system 80 includes a loader 85 and an unloader 86, and a main conveyor 87 extending between the loader 85 and the marking station 84 and adapted to transport loaded PCBs to and through the inspection station 82. This having been done, as inspected PCB is then further transported towards the marking station 84, associated with which is a separate conveyor table 88. The loader 85 may be of any known type, for example such as PCB Car. Automat MA 6095067 commercially available from Rescotron, Italy. The marking station 84 also employs a belt conveyor having a plurality of spaced apart belts which are slightly inclined toward the side frame 41 so that as a PCB is conveyed through the marking station 84, a side edge of the PCB is maintained flush with an inner surface of the side frame 41 thereby maintaining correct registration of the PCB.

It should be noted that the provision of the conveyor table 88 is optional, to exemplify the most general case of processing workpieces at more than one working station. In the specific example of optical inspection of printed circuit boards having an artwork thereon, the conveyor table 88 is associated with a marking assembly, and comprises a conveying mechanism adapted to receive the inspected PCB from the main conveyor 87 and further transfer it towards the unloader 86, which will be described in more detail further below. The main conveyor 87 is enclosed between spaced parallel side frames 89 and operates to convey the loaded PCB in a conveying direction, shown by arrow D1 in FIG. 9.

It will be appreciated that reliable scanning requires proper mounting of the progressing PCB on a working table, or other supporting surface, so as to ensure its precise positioning in a registration corner, and allow it to be perfectly guided relative to the supporting surface. As noted above, one of the particular features of the present invention is the provision of a feeder 90 installed upstream and downstream of the inspection station 82. The feeder 90 is provided with a registration means defining two registration shoulders at right-angles to each other which are engageable with a registration corner of the PCB in order to position it precisely for processing. Construction of the feeder 90 and its relationship with the main conveyor 87 is as described above with reference to FIG. 6a of the drawings.

Thus, the PCBs which are to be inspected are stacked and supported by a self-leveling supply table 91, which includes an automatic lifting mechanism for continuously raising the level of the stack so as to maintain the topmost PCB 82a at a predetermined vertical position wherein it is at the same level as the main conveyor 87. Also provided is a loading carriage 92 having a plurality of suction cups 93 for capturing the topmost PCB 82a from the stack 82 and being adjusted for sliding movement along a sliding rail 94 between the supply table 91 and the feeder 90.

It will be understood that the loader 85 may be of alternative construction, and may, for example, comprise additional conveying means adapted to receive the topmost PCB 82a from the table 91 and to transfer it onto the feeder 90.

A stack of inspected PCBs 95 is supported by a similar, self-leveling collecting table 96 which may either comprise a similar unloading carriage, or conveying and air cushion means. Alternatively, the collecting table 96 may include several selectively enabled conveying mechanisms for transporting the inspected PCBs in different directions according to corresponding sort criteria.

Preferably, the collecting table 96 is provided with a plurality of wheels 97 rotatably supported on a pin 98 in a spaced apart parallel relationship along its length, and a gripper assembly, generally designated 99. The pin 98 is disposed transverse to the conveying direction D1 in which PCBs arrive onto the collecting table 96. The gripper assembly 99 is mounted for slidable movement above the surface of the table 96 in a direction towards and away from the wheels 97 parallel to the conveying direction D1. The construction and operation of the gripper assembly 99 will be described more specifically below with reference to FIGS. 10a to 10d of the drawings.

Also provided is a guiding mechanism generally denoted 100, which is supported by the side frames 89 of the main conveyor 87 and is adapted for guiding the advance of the PCBs in the conveying direction D1 during processing. The guiding mechanism 100 is as described above with reference to FIGS. 6a to 6c of the drawings.

The preferred embodiments have been described with particular reference to spaced apart conveyor belts interacting with the feeder means disposed between adjacent belts for lowering and raising a supporting surface thereof relative to a support surface of the conveyor belts. However, it is to be understood that the principles of the invention are equally applicable for use with a single conveyor belt conveying thereon workpieces which are themselves wider than the conveyor belt. Such workpieces may then be released onto and lifted off the conveyor belts by means of a feeder and transfer mechanism disposed on opposite sides of the conveyor belt.

What is claimed is:

1. A system for continuously inspecting successive workpieces along a production line comprising:

a conveyor extending continuously from a loading location to an unloading location past an inspection location such that placement of an article on the conveyor at the loading location would produce generally simultaneous mechanical disturbances in the conveyor at the inspection location; and a loader for placing workpieces onto said conveyer at said loading location, said loader being operative to avoid placing workpieces onto said conveyor at times when a workpiece is located at said inspection location, thereby avoiding disturbing inspection due to motion of the conveyor resulting from placing workpieces thereon.

2. A system for continuously inspecting successive workpieces along a production line according to claim 1 and also comprising an unloader for removing workpieces from said conveyer at said unloading location, said unloader being operative to avoid removing workpieces from said conveyor at times when a workpiece is located at said inspection location, thereby avoiding disturbing inspection due to motion of the conveyor resulting from removing workpieces therefrom.

3. A system for continuously inspecting successive workpieces along a production line according to claim 1 and wherein said conveyor comprises a belt conveyor assembly.

4. A system for continuously inspecting successive workpieces along a production line according to claim 2 and wherein said conveyor comprises a belt conveyor.

5. A system for continuously inspecting successive workpieces along a production line according to claim 3 and wherein said conveyor comprises a belt conveyor.

6. A system for continuously inspecting successive workpieces along a production line according to claim 1 and wherein said conveyor comprises a multiple belt conveyor.

7. A system for continuously inspecting successive workpieces along a production line according to claim 2 and wherein said conveyor assembly comprises a multiple belt conveyor.

8. A system for continuously inspecting successive workpieces along a production line comprising:

a conveyor extending continuously from a loading location to an unloading location past an inspection location such that removal of an article from the conveyor at the unloading location would produce generally simultaneous mechanical disturbances in the conveyor at the inspection location; and an unloader for removing workpieces from said conveyer at said unloading location, said unloader being operative to avoid removing workpieces from said conveyor at times when a workpiece is located at said inspection location, thereby avoiding disturbing inspection due to motion of the conveyor resulting from removing workpieces therefrom.

9. A system for continuously inspecting successive workpieces along a production line according to claim 8 and wherein said conveyor comprises a multiple belt conveyor.

* * * * *